(12) United States Patent
Shioji et al.

(10) Patent No.: US 7,138,288 B2
(45) Date of Patent: Nov. 21, 2006

(54) METHOD FOR MANUFACTURING SMALL CRYSTAL RESONATOR

(75) Inventors: Akihiro Shioji, Tokyo (JP); Tohru Yanagisawa, Kodaira (JP)

(73) Assignee: Citizen Watch Co., Ltd., Tokyo (JP)

( * ) Notice: Subject to any disclaimer, the term of this patent is extended or adjusted under 35 U.S.C. 154(b) by 190 days.

(21) Appl. No.: 10/808,485

(22) Filed: Mar. 25, 2004

(65) Prior Publication Data
US 2004/0191944 A1 Sep. 30, 2004

(30) Foreign Application Priority Data
Mar. 28, 2003 (JP) ............................. 2003-089618

(51) Int. Cl.
*H01L 21/00* (2006.01)
(52) U.S. Cl. ........................ 438/50; 29/25.35
(58) Field of Classification Search .................. 438/50
See application file for complete search history.

(56) References Cited

U.S. PATENT DOCUMENTS

RE32,931 E * 5/1989 Staudte .................... 73/504.16
5,420,548 A * 5/1995 Nakajima .................... 331/65
5,912,524 A * 6/1999 Ohnishi et al. ............. 310/321

FOREIGN PATENT DOCUMENTS

| JP | 05-315881 | 11/1993 |
|---|---|---|
| JP | 6-44234 | 6/1994 |
| JP | 08-018371 | 1/1996 |
| JP | 10-170272 | 6/1998 |

* cited by examiner

*Primary Examiner*—Stephen W. Smoot
(74) *Attorney, Agent, or Firm*—Smith, Gambrell & Russell, LLP

(57) ABSTRACT

A crystal resonator area and side electrode shielding/formation blocks thereabout are formed on a crystal substrate through etching with both areas kept separate from each other with a gap. Vapor deposition is diagonally applied through this gap toward the side of the crystal substrate to thereby form an electrode film divided into two portions in the thickness direction of the substrate on the side.

9 Claims, 8 Drawing Sheets

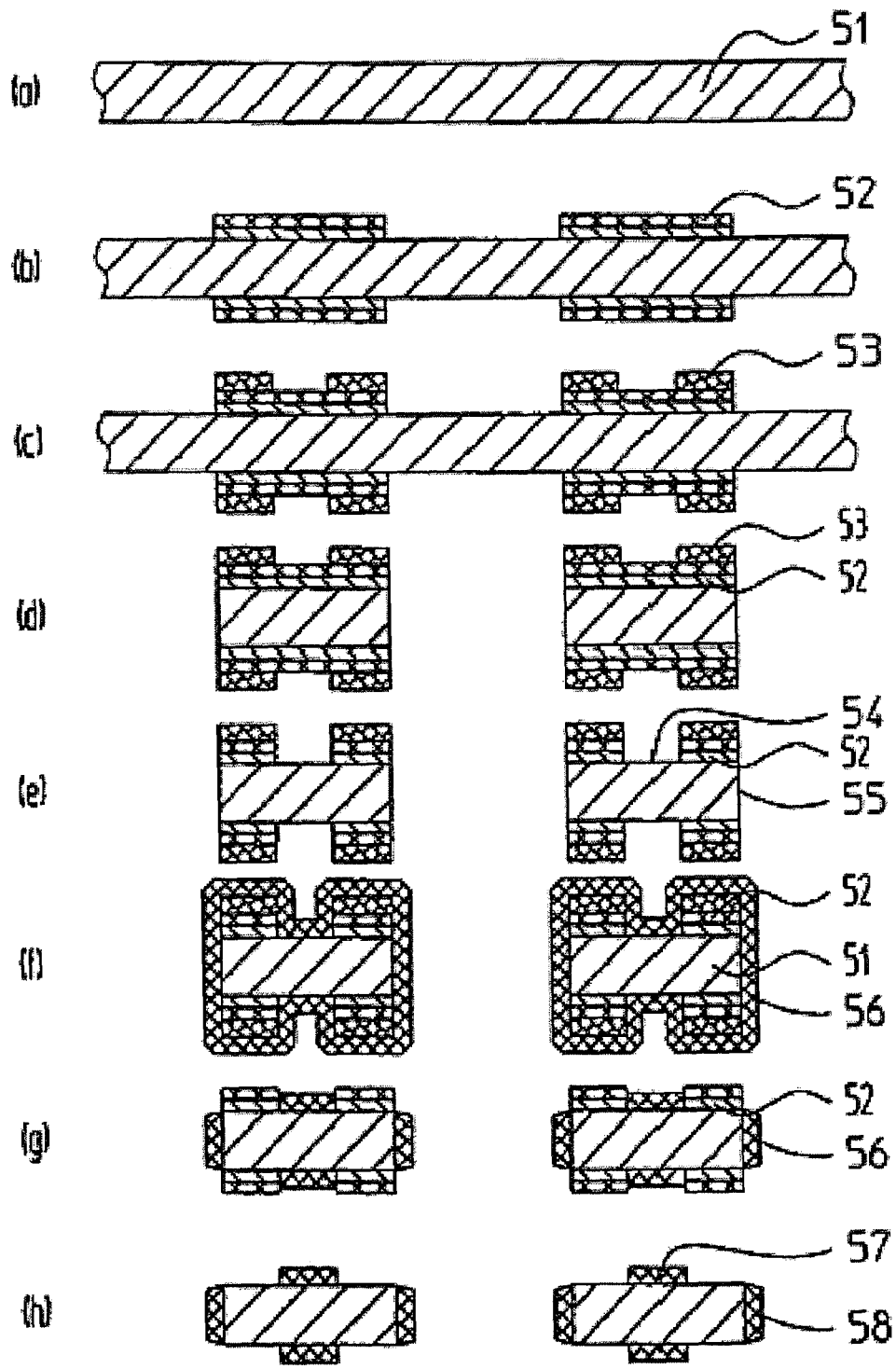
FIG. 7 --PRIOR ART--

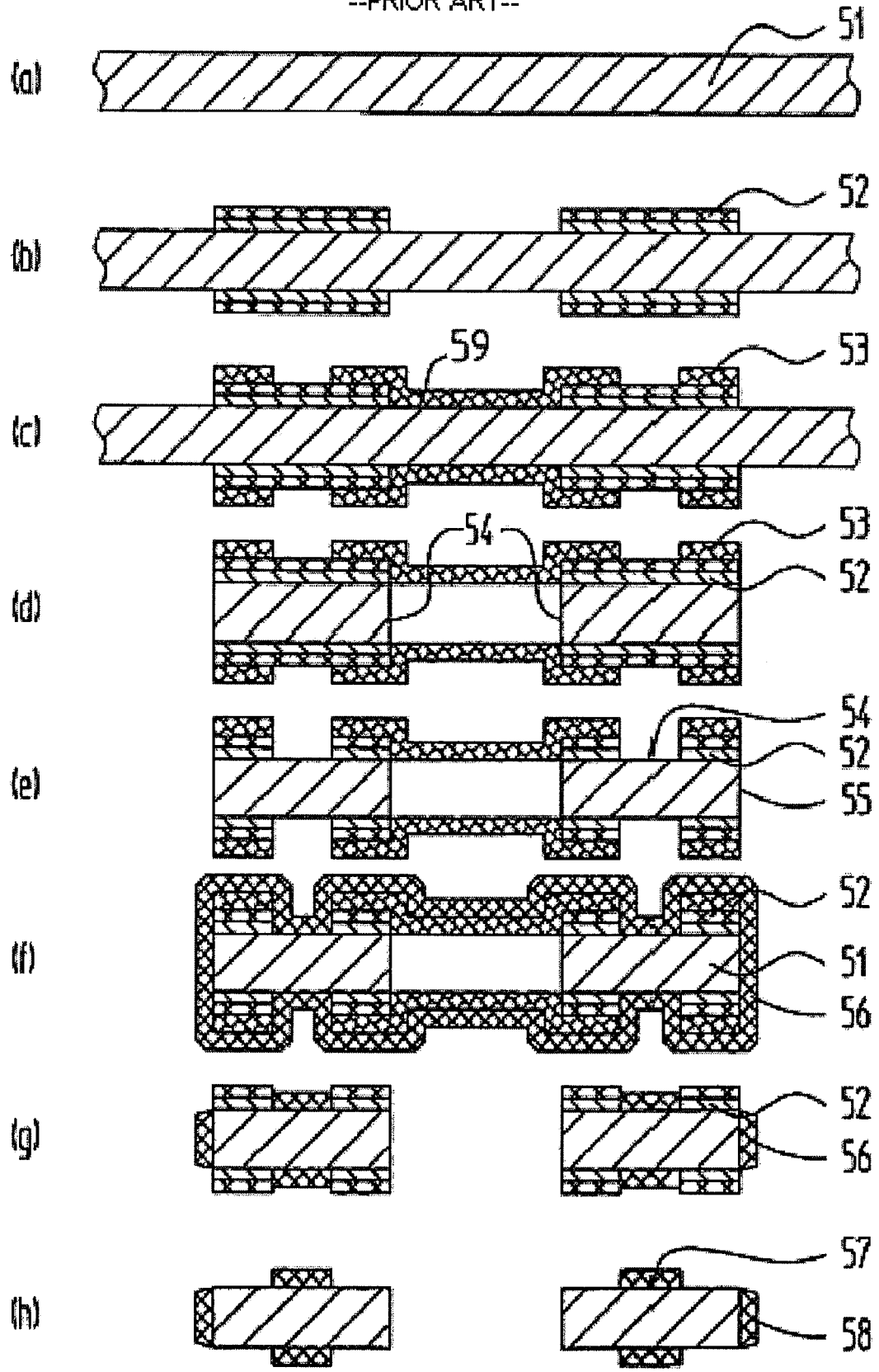

--PRIOR ART--

--PRIOR ART--

METHOD FOR MANUFACTURING SMALL CRYSTAL RESONATOR

BACKGROUND OF THE INVENTION

1. Field of the Invention

The present invention relates to a method of manufacturing a crystal resonator whereby an ultra-small crystal resonator used as a quartz crystal tuning fork, thickness-shear mode crystal resonator or gyro sensor crystal resonator using a photolithography technology and chemical etching technology.

2. Description of the Related Art

Various electronic products using parts provided with a crystal resonator have an increasing tendency to be implemented as portable devices; becoming smaller in size and being provided with higher functions in recent years. Moreover, not only a frequency signal of vibration output from a crystal resonator is used but a crystal resonator is recently used for a gyro sensor, too. For this reason, there is a limitation to a conventional manufacturing technology in satisfying the above described requirement while maintaining the characteristic of the resonator and further improvements in manufacturing processes are required.

A resonator generally used is an ultra-small crystal resonator such as a quartz crystal tuning fork and thickness-shear mode crystal resonator. One of generally used methods for manufacturing such a crystal resonator is a method using a photolithography technology and chemical etching technology disclosed, for example, in Japanese Patent Application Laid-Open No. 5-315881. Thus, the method of manufacturing this conventional small crystal resonator (quartz crystal tuning fork) will be explained using FIG. 7 and FIG. 8. FIG. 7 is a cross-sectional view of a tuning fork branching section of a crystal resonator and FIG. 8 is a cross-sectional view of the tip of the tuning fork of the crystal resonator.

First, as shown in FIG. 7(a) and FIG. 8(a), a crystal substrate 51 is cut out of a crystal raw stone at a predetermined angle and subjected to polishing to a predetermined thickness.

Then, a photoresist (not shown) is formed on both sides of the crystal substrate 51 using a spin-coating method. Then, using a predetermined photomask, it is exposed to light using a predetermined photomask, subjected to development processing and the photoresist is patterned. This patterned photoresist is used as an etching mask to carry out etching and as shown in FIG. 7(b) and FIG. 8(b), a metal film 52 made up of laminated films of chromium (Cr) and gold (Au) is formed on both sides of the crystal substrate 51 in a tuning fork shape.

Then, a photoresist is formed over the entire surface of the crystal substrate 51 including the metal film 52 using a spin-coating method, subjected to exposure to light and development processing and a photoresist 53 having an inverted shape of the surface electrode is formed on the metal film 52 as shown in FIG. 7(c) and FIG. 8(c). Furthermore, in the section corresponding to a surface space 54 between the neighboring tuning fork branching sections of the tip of the resonator, the applied photoresist 53 is left through patterning as shown in FIG. 8(c) and a side adjusting resist 59 having a shape which bridges those tuning fork branching sections is formed. As a result, the side adjusting resist 59 functions as a protective film on the inner side close to the end of the tuning fork branching section and no electrode film 56 is formed.

Then, using the photoresist 53 and metal film 52 as masks, the crystal substrate 51 is subjected to etching and a resonator shape is formed as shown in FIG. 7(d) and FIG. 8(d) (these figures only show the cross section of the branching section). At the same time, the part of the crystal substrate 51 coated with the side adjusting resist 59 is also removed through etching. Etching is applied to this part by an etching liquid wrapping around from the side, and therefore it takes more time than other parts.

Then, using the photoresist 53 as a mask, the metal film 52 is subjected to etching and a surface space 54 for formation of an electrode film is formed as shown in FIG. 7(e) and FIG. 8(e). Then, as shown in FIG. 7(f) and FIG. 8(f), an electrode film 56 is evaporated onto the entire surface including the side of the crystal substrate 51 using a vacuum deposition method, etc.

Then, as shown in FIG. 7(g) and FIG. 8(g), the photoresist 53 and the electrode film 56 formed on this photoresist 53 are removed. The photoresist 53 is removed by immersing the photoresist 53 in a heated solvent and dissolving the photoresist 53. This solvent reaches the photoresist 53 through pinholes of the electrode film 56 and dissolves the photoresist 53. At this time, the electrode film 56 formed on the crystal substrate 51 is adhered to the crystal substrate 51 and not peeled away because its adhesion is strong.

Finally, by removing the metal film 52 having the inversed pattern shape of the surface electrode through etching, a surface electrode 57 and a side electrode 58 are formed on the crystal substrate 51 (tuning fork branching section) as shown in FIG. 7(h) and FIG. 8(h). For etching of this metal film 52, the aforementioned etching liquids for gold and chromium are used. At this time, since this electrode film 56 is made of a material not etched by the etching liquids for gold and chromium, titanium and palladium, the electrode film 56 remains without being etched. As a result, each electrode is formed.

Recently, however, a detection side electrode 64 divided in the thickness direction of the resonator is often formed on the side of the resonator. An example of this is disclosed in Japanese Patent Application Laid-Open No. 10-170272 and this will be explained using FIG. 9. The crystal resonator shown in FIG. 9 comprises a drive tuning fork section 61, a detection tuning fork section 62, a tuning fork support section 63 and a detection side electrode 64. When this resonator is used as a quartz crystal tuning fork for a gyro sensor, it is necessary to lay an electrode on the drive tuning fork section 61 for exciting the resonator and the detection tuning fork section 62 for detecting a signal according to an angular velocity. This electrode is laid along four ridge lines of the crystal branching section in the longitudinal direction of the tuning fork. For this reason, in FIG. 9, bisected electrodes (detection side electrodes 64) extending in the longitudinal direction are formed on the right and left sides of the respective detection tuning fork sections 62.

This bisected detection side electrode 64 is formed by positioning and attaching a metal mask to a crystal substrate and vacuum-evaporating Cr+Au (e.g., an Au film is formed on a Cr film) metal particles onto the crystal substrate from a direction inclined by a certain angle with respect to the direction of the normal thereto.

However, it is not possible to form the bisected side electrode as shown in FIG. 9 using the conventional technology explained with reference to above described FIG. 7 and FIG. 8. That is, according to the manufacturing method shown in FIG. 7, the side electrode 58 is necessarily formed over the entire area of the crystal substrate for reasons related to the nature of the process and when the side adjusting resist 59 is bridged over the surface space 54 as shown in FIG. 8(d), no side electrode 58 is formed.

Furthermore, because the resist functions as an etching stopper, crystal etching right below the side adjusting resist 59 which functions as a bridge is prevented in the thickness direction, that is, the Z-axis direction, and therefore the etching rate is extremely slowed down compared to other locations. Therefore, the situation of progress of crystal etching becomes nonuniform between the tuning fork branching sections and it is difficult to keep the cross-sectional shape constant over the entire area of the branching section, which may cause deterioration of the characteristic of the resonator.

On the other hand, according to the method of manufacturing the crystal resonator shown in FIG. 9, the electrode is formed on the side of the resonator using a metal mask, and therefore the patterning accuracy of the electrode is determined by the machining accuracy of the metal mask body and vapor deposition jig or mechanical mask positioning accuracy of the apparatus. When an ultra-small crystal resonator requiring high precision patterning technology is manufactured, there is a limitation to the accuracy of wiring formation using the mechanical technique using a metal mask jig or apparatus. There is also a disadvantage that the process is complicated.

As is evident from the above described explanations, when an ultra-small crystal resonator is manufactured, the problem is how to make a high-precision crystal shape machining technology and a high-precision electrode patterning technology mutually compatible.

Furthermore, a method of forming an electrode bisected in the thickness direction of the substrate on the side of a thin crystal substrate of the excitation section of the crystal resonator without using any metal mask is disclosed in Japanese Patent Application Laid-Open No. 8-18371. As shown in FIG. 10, this method performs etching starting from both the upper and lower surfaces of the excitation section (crystal substrate 70) and forms etching grooves 71 with a connection section 73 having a thickness of t2 left in the center in the thickness direction of the crystal substrate 70. Then, as shown by an arrow in FIG. 10, vapor deposition is applied diagonally toward the inner surface of the grooves 71 to form a film on the electrode 72 on the inner surface of the grooves. Then, when the connection section 73 is removed, side electrodes 72 (detection electrodes) divided into upper and lower portions are formed on the sides of the crystal substrate 70.

However, with regard to the grooves 71 formed in the crystal substrate 70 through etching, the shape close to the groove bottom varies greatly depending on the temperature, concentration of the solvent for etching the crystal substrate 70, etching duration and anisotropy of etching of the crystal, and therefore the sectional shape of the grooves 71 does not become rectangular as shown in FIG. 10, but the shape actually becomes narrower near the bottom of the grooves 71 and its cross-sectional shape becomes irregular and no uniform vertical wall is formed up to the bottom of the grooves. Especially the influence of etching anisotropy of the crystal is considerable and while one side of the groove wall becomes substantially vertical, the other wall becomes sloped.

For this reason, when vapor deposition is carried out diagonally toward the inner side of the grooves 71 formed through etching, the width (size in the thickness direction of the crystal substrate 70) of the electrode 72 evaporated on the inner side is not constant. Thus, the cross section of the groove formed through etching is irregular, and therefore even if vapor deposition is applied to the inner surface, it is difficult to predict the size of the electrode to be formed or form the electrode to the same height and the same film thickness with respect to both the right and left inner surfaces.

SUMMARY OF THE INVENTION

It is an object of the present invention to provide a method of manufacturing a crystal resonator capable of solving the above described problems and forming a pattern of an electrode easily and at a high degree of accuracy even for an ultra-small crystal resonator.

In order to attain the above described object, the method of manufacturing a crystal resonator using a crystal substrate comprises a step of forming a crystal resonator area and side electrode shielding/formation blocks thereabout on the crystal substrate through etching by leaving a partial connection section and with both areas kept separate from each other with a gap, and a step of applying vapor deposition through the gap diagonally toward the side of the crystal substrate, producing an area where a film is formed on the side and an area where film formation is prevented by the existence of the side electrode shielding/formation blocks and thereby forming an electrode film bisected in the thickness direction of the substrate on the side.

Furthermore, by adjusting the size of the gap between the crystal resonator area and the side electrode shielding/formation block, the side electrode shielding/formation block may be constructed of an area where the divided electrode film is formed and an area where formation of the electrode film is prevented.

BRIEF DESCRIPTION OF THE DRAWINGS

The aforementioned and other objects and features of the invention will become more apparent from the following detailed description of a preferred embodiment of the invention with reference to the drawings, in which:

FIG. 7 is a cross-sectional view of a tuning fork branching section to illustrate the method of manufacturing a quartz crystal tuning fork according to a conventional technology;

FIG. 8 is a cross-sectional view of the tip of a tuning fork using to illustrate the method of manufacturing a quartz crystal tuning fork according to the conventional technology;

DESCRIPTION OF THE EMBODIMENTS

Figure 1:
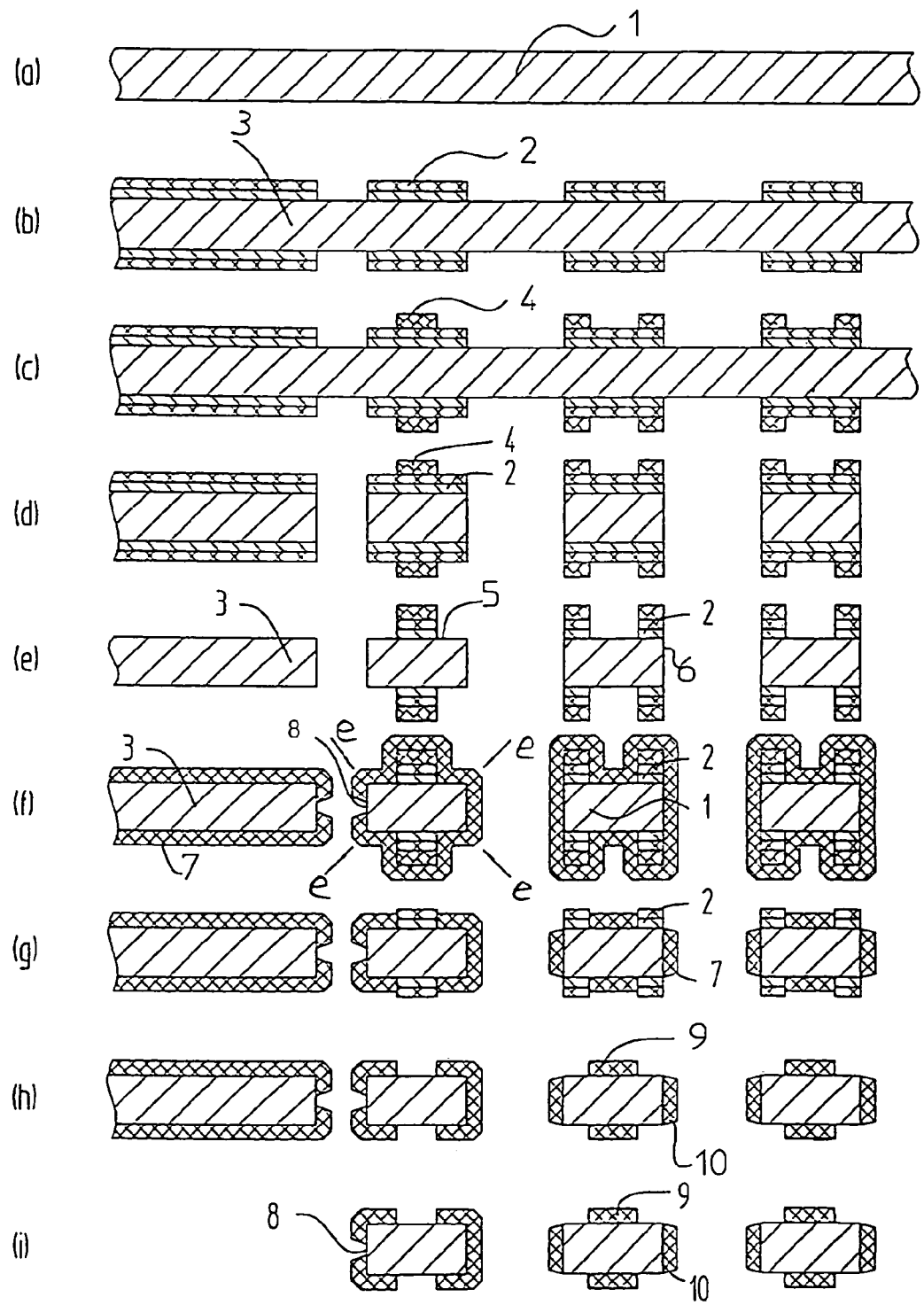
FIG. 1 illustrates a method of manufacturing a crystal resonator according to a first embodiment of the present invention.
Figure 2A:
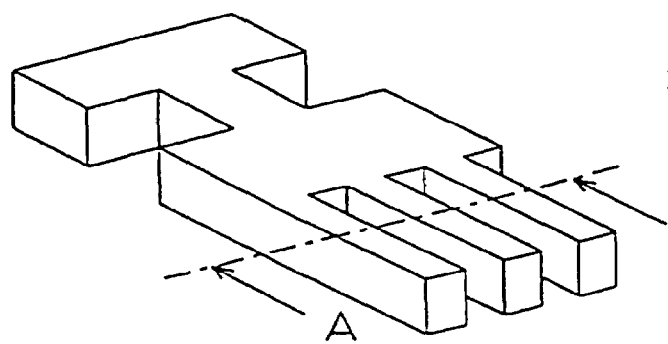
FIG. 2A is a perspective view of a crystal resonator used for a gyro sensor and FIG. 2B illustrates a method of applying vapor deposition diagonally to the crystal resonator shown in FIG. 2A.
Figure 2B:
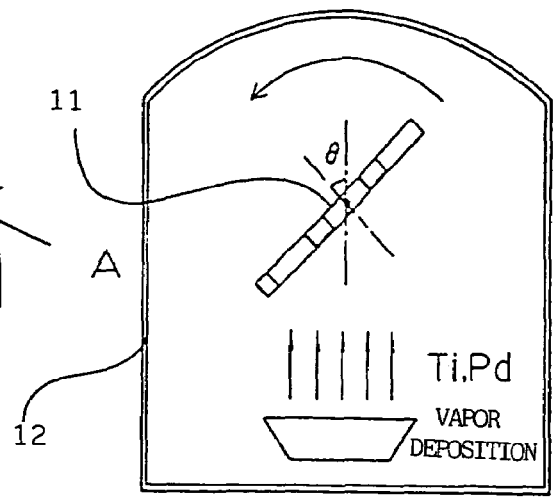
Figure 3:
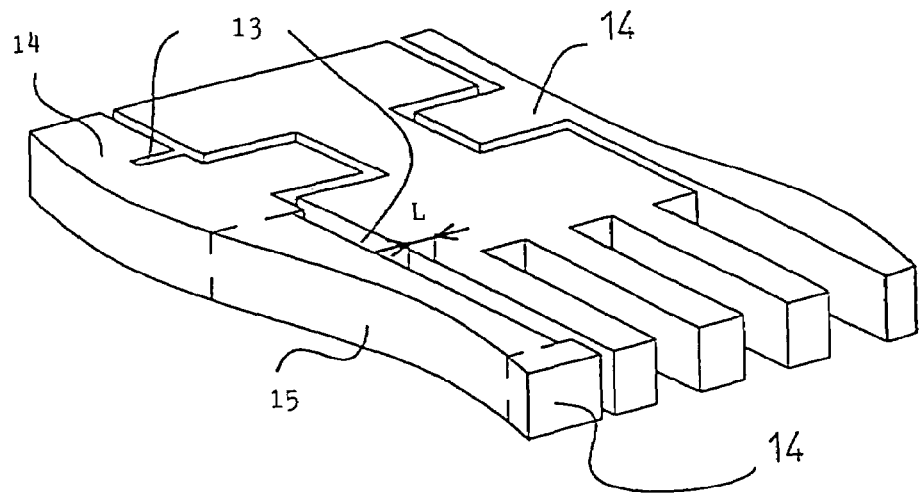
FIG. 3 is a perspective view illustrating a method of forming an electrode on a quartz crystal tuning fork according to the method of the present invention.

With reference now to FIG. 1 to FIG. 3, the method of manufacturing a crystal resonator according to a first embodiment of the present invention will be explained below. A feature of the manufacturing method according to the present invention is that a side electrode shielding/formation block is provided and in a vapor deposition step, vacuum deposition is performed by rotating a crystal substrate in the longitudinal direction of a tuning fork and around the rotation axis which extends in the horizontal direction in such a way that the direction of the normal to the plane of the crystal substrate forms a predetermined angle of θ with respect to the vapor deposition direction.

As shown in FIG. 1 and FIG. 3, a side electrode shielding/formation block 3 formed of a crystal substrate is constructed of a side electrode shielding crystal block 14 (hereinafter referred to as "shielding block") and a side electrode division/generation crystal block 15 (hereinafter referred to as "division block"). The shielding block 14 is intended to prevent film formation on its side against vapor deposition onto the side of the substrate. When this shielding block 14 is placed at a position extremely close to the substrate, vapor deposition is prevented and no electrode is formed on the facing side of the substrate. However, since a crystal etching step needs to be performed stably, the shielding block 14 needs to be kept separate from the periphery of the crystal resonator body at least approximately 70 microns (μm).

On the other hand, the division block 15 is intended to form an electrode film on the side of the crystal substrate 1 divided into two portions in the thickness direction of the substrate through vapor deposition. The area of the electrode film formed on the side of the crystal substrate 1 is determined by an angle θ of vapor deposition (see FIG. 2B) and a distance L (see FIG. 3) between the crystal resonator and division block 15. For example, when electrode films of 100 μm in the thickness direction are formed on upper and lower parts of the side of the crystal substrate having a thickness of 250 μm through vapor deposition, if the vapor deposition angle θ is set to 45 degrees, the distance L between the crystal resonator and division block 15 is 100 μm. When the vapor deposition angle θ is set to 55 degrees, the distance L is approximately 143 μm.

Figure 4:
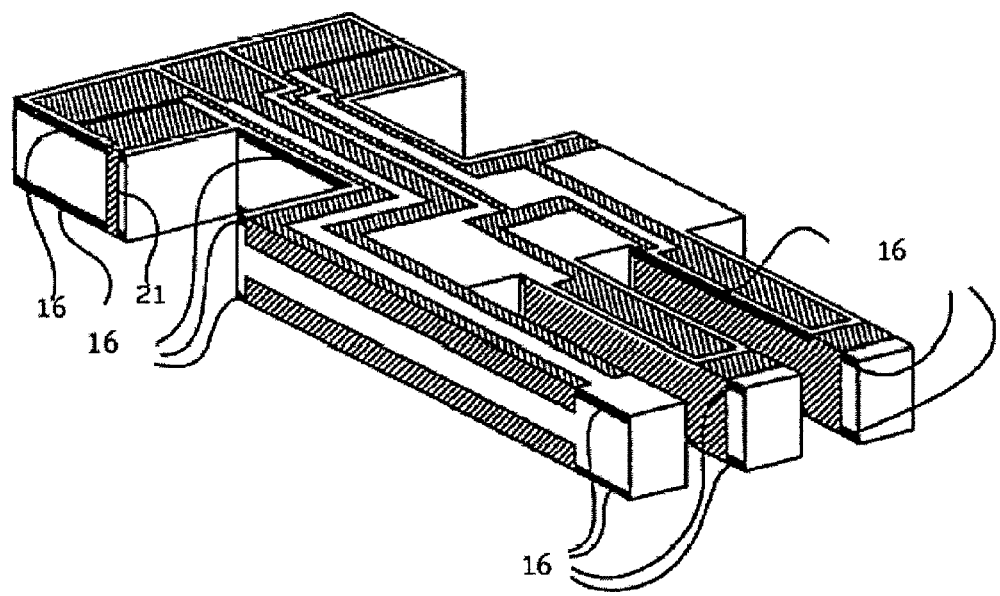
FIG. 4 is a perspective view showing a crystal resonator with an electrode film formed using the method of the present invention.

As shown in FIG. 4, at locations corresponding to the areas where wiring electrodes 21 connecting one side to the other side of the crystal resonator need to be laid along the side of the crystal resonator, pattern formation grooves 13 are formed in the shielding blocks 14 as shown in FIG. 3. Though it depends on the vapor deposition angle θ, if a depth equal to or greater than the thickness of the crystal substrate is given to these pattern formation grooves 13, it is possible to form an electrode to be laid on the opposite side through the pattern formation grooves 13 through vapor deposition at the angle of θ.

FIG. 2A is a perspective view showing the shape of a crystal resonator used for a gyro sensor. FIG. 2B illustrates a specific technique for applying vacuum deposition of an electrode film to the crystal resonator shown in FIG. 2A. FIG. 2B shows an A—A cross section of the tuning fork branching section of the crystal resonator shown in FIG. 2A viewed from the direction indicated by the arrow. As a material for forming the electrode film, titanium (Ti) and palladium (Pd) are used. That is, titanium and palladium which are materials of the electrode film are put in a crucible in a vacuum vapor deposition apparatus 12 first and then the crystal resonator is mounted in a crystal resonator mounting jig 11. The crystal resonator mounted in the mounting jig 11 is supported together with the mounting jig 11 in a rotatable manner on a rotation axis whose axial center extends in the longitudinal direction of the tuning fork of the crystal resonator on the horizontal plane. FIG. 2B shows vapor deposition being applied to the crystal resonator with the crystal resonator inclined by rotating it around the rotation axis in such a way that the direction of the normal to the plane of the crystal substrate making up the crystal resonator forms an angle of θ (vapor deposition angle) with respect to the vapor deposition direction (vertical direction).

The manufacturing process for the crystal resonator according to a first embodiment of the present invention will be explained using FIG. 1. FIG. 1 is a cross-sectional view along a line A—A of the tuning fork branching section of the crystal resonator shown in FIG. 2A.

As shown in FIG. 1(a), a crystal substrate 1 is cut out of a crystal raw stone at a predetermined angle first and after polishing it, the crystal substrate 1 is formed to a predetermined thickness. The thickness of this crystal substrate 1 is set to approximately 100 to 350 μm.

Then, a metal film 2 made up of laminated films of chromium (Cr) and gold (Au) is formed. This metal film 2 is formed using a vacuum deposition method or sputtering, etc., and the film thickness is set to approximately 500 to 2000 Angstrom. Then, a photoresist (not shown) is formed over the entire surface using a spin-coating method, exposed to light using a predetermined photomask and subjected to development processing and the photoresist is patterned. Using this patterned photoresist as an etching mask, photo etching is applied to the metal film 2 to form the shape corresponding to the tuning fork part and the shape corresponding to the side electrode shielding/formation block 3 as shown in FIG. 1(b).

Then, a photoresist is formed over the entire surface of the crystal substrate 1 including the metal film 2 using a spin-coating method, exposed to light and subjected to development processing to form a photoresist 4 having a shape which is the inverted shape of a surface electrode 9 (see FIG. 1(h)) as shown in FIG. 1(c). This photoresist 4 may be either of a positive type or negative type.

Then, using the metal film 2 and photoresist 4 as etching masks, the crystal substrate 1 is subjected to etching using an etching solution such as ammonium fluoride. At this time, the metal film 2 and photoresist 4 are designed to be able to withstand the liquid used when the aforementioned crystal substrate 1 is subjected to etching. As a result, as shown in FIG. 1(d), the crystal substrate 1 is transformed into a tuning fork part and side electrode shielding/formation block 3 having the same shape as that of the metal film 2.

Then, using the photoresist 4 as an etching mask, the metal film 2 formed on both sides of the crystal substrate 1 is subjected to etching. Through this processing, as shown in FIG. 1(e), areas 5 and 6 on which electrode films (surface electrode 9 and side electrode 10 shown in FIG. 1(h)) are to be formed are exposed on the surface and side of the crystal substrate 1.

Then, as shown in FIG. 1(f), an electrode film 7 is formed on the crystal substrate 1 and photoresist 4 using a vacuum deposition method. This electrode film 7 is preferably formed of a material different from that of the metal film 2. For example, laminated films of Ti and Pd are used. The film thickness of this electrode film 7 is set to approximately 500 to 1500 Angstrom. Furthermore, when applying vapor deposition, the temperature for forming the electrode film 7 is preferably close to a normal temperature in order to prevent deterioration of the photoresist 4 remaining on the metal film 2 at a high temperature.

Furthermore, according to the manufacturing method of this embodiment, the crystal resonator (crystal substrate 1) is supported on the rotation axis which extends in the longitudinal direction of the resonator tuning fork on the horizontal plane in the vapor deposition apparatus. Then, when the electrode film 7 is formed, vacuum deposition of the Ti film and Pd film is performed with the crystal substrate 1 inclined by rotating it around the rotation axis in such a way that the direction of the normal to the plane thereof forms an angle of $\theta$ with respect to the vapor deposition direction as shown in FIG. 2B. More specifically, the angle $\theta$ is set within a range of 30 to 60 degrees or preferably within a range of 45 to 55 degrees. Furthermore, as indicated by four arrows e in FIG. 1(*f*), it is preferable to apply vapor deposition a total of four times; obliquely from above and obliquely from below to the left side of the crystal substrate 1 and obliquely from above and obliquely from below to the right side, carrying out one vapor deposition at a time.

In order to apply the manufacturing method of the present invention effectively, it is preferable to set $100 \mu m \leq t \leq 350 \mu m$, where t is the thickness of the crystal substrate in addition to the range of the vapor deposition angle of $\theta$. According to the manufacturing of this embodiment, the limit to the thickness of the crystal substrate within which a divided electrode can be formed is 100 µm and a crystal substrate having a thickens exceeding 350 µm can be handled by a conventional vapor deposition method using a mask, and therefore this range can be said to be an optimal range in this embodiment.

Furthermore, assuming that the distance between the two divided electrodes on the side of the tine for detection of Coriolis force out is d, it is preferable to set $0.15 t \leq d \leq 0.25 t$.

Vapor deposition is carried out four times by changing the above described directions on the surface and side sandwiching each one of the four ridge lines of the crystal resonator. In order to make the thickness of the vapor deposition film onto the surface and side sandwiching one ridge line as uniform as possible, it is preferable to set the vapor deposition angle $\theta$ as close to 45 degrees as possible. When the structural design inside the wafer of the crystal resonator and division block 15 and mounting jig 11, etc., are taken into consideration, the allowable range of the vapor deposition angle $\theta$ will be within a range of 30 to 60 degrees.

Here, when the vapor deposition angle $\theta$ is set to 50 degrees, the angles $\theta$ (actually the angle at which the crystal substrate 1 is rotated around the rotation axis) in three out of four vapor deposition directions are 130 degrees, 230 degrees and 310 degrees, respectively.

As a result, the electrode film 7 is formed over the entire surface area of the crystal resonator and the entire area of the side of the crystal resonator which has no facing side electrode shielding/formation block 3 in proximity. However, for the side of the crystal resonator facing the side electrode shielding/formation block 3 in proximity, if the side electrode shielding/formation block 3 is the shielding block 14 as shown in FIG. 3, almost no vapor deposition is performed. On the other hand, when the side electrode shielding/formation block 3 is the division block 15, vapor deposition from a diagonal direction is partially blocked by this division block 15 and a side electrode film 8 divided into upper and lower portions is formed with no electrode film 7 at the center in the thickness direction of the side.

Thus, by arbitrarily arranging the side electrode shielding/formation blocks 3, it is possible to prevent the electrode film 7 from being formed in areas requiring no side electrode. That is, it is possible to apply patterning of the electrode film 7 only to necessary areas and form the electrode film 7 having a complicated side wiring structure and it is greatly effective in widening the range of the method of manufacturing the crystal resonator. Especially, this method is applicable to a resonator of a gyro sensor, etc., and can improve the accuracy a great deal.

Thus, after forming the electrode film 7 and the divided electrode film 8, as shown in FIG. 1(*g*), the photoresist 4 and the electrode film 7 formed on this photoresist 4 are removed. The photoresist 4 is removed by immersing it in a humidified solvent and dissolve the photoresist 4 in the solvent. This solvent reaches the photoresist 4 through pinholes of the electrode film 7 and dissolves the photoresist 4. At that time, the electrode film 7 formed on the crystal substrate 1 adheres to the crystal substrate 1 and is not peeled away.

Then, by removing the metal film 2 having a pattern shape which is the inverse shape of the surface electrode 9 is removed through etching, the surface electrode 9 and side electrode 10 are formed as shown in FIG. 1(*h*). For etching of this metal film 2, the aforementioned etching liquids of Au and Cr are used. At this time, since the electrode film 7 is made of Ti and Pd which are materials that are not etched by the etching liquid of the metal film 2 made of Au and Cr, the electrode film 7 remains without being etched.

Then, as shown in FIG. 1(*i*), the crystal resonator with the side electrode shielding/formation block 3 removed is extracted and a crystal resonator having the electrode 9, side electrode 10 and divided side electrode film 8 is obtained. This is the process of manufacturing the crystal resonator to which the present invention is applied.

However, it is actually impossible to completely shield the top end and bottom end of the side of the crystal substrate 1 with the side electrode shielding/formation block 3 (shielding block 14 or division block 15) in the vacuum deposition step of the electrode film, and therefore extra side electrodes 16 as shown in FIG. 4 are necessarily formed in addition to the desired electrode film. Thus, after completion of the steps in FIG. 1, the extra side electrodes 16 are removed using a laser repair apparatus (not shown) to complete the crystal resonator. The laser repair apparatus irradiates the extra side electrodes 16 with laser light and removes the electrodes 16 by flicking them away.

Figure 5:
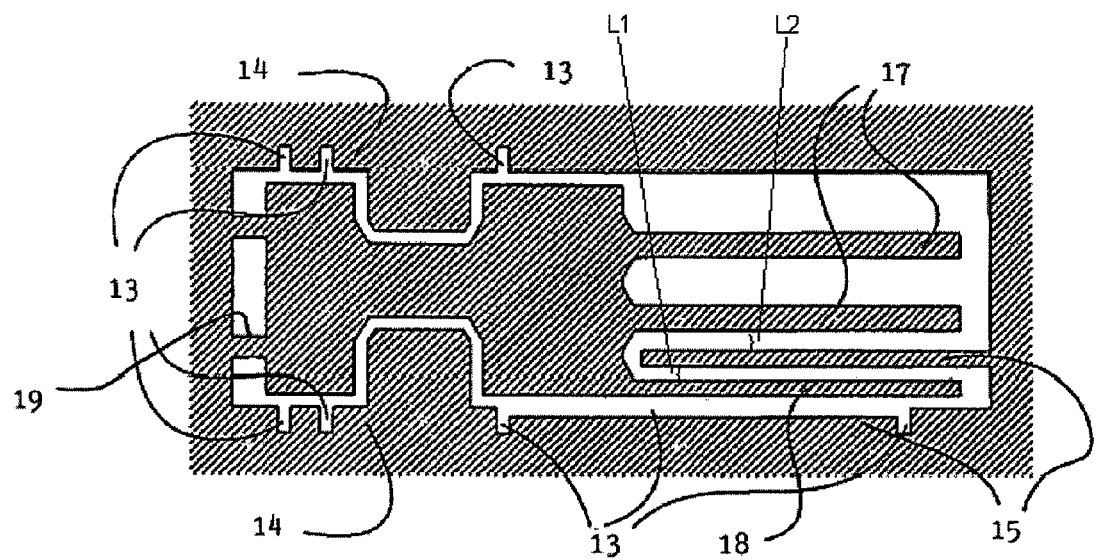
FIG. 5 illustrates manufacturing of a quartz crystal tuning fork using side electrode shielding/formation blocks according to a second embodiment of the present invention.

FIG. 5 is a plan view showing a configuration of a quartz crystal tuning fork according to a second embodiment of the present invention. This crystal resonator is used for a gyro sensor and patterning of side electrodes is required in three locations; laying part in the base to lay an electrode from the surface to the back of the crystal resonator, both sides of a tuning fork drive section 17 and both sides of a detection section 18 which is a portion where detection electrodes are formed.

Since no side electrode is normally formed on the side of the base of the crystal resonator, shielding blocks 14 are placed around the base to prevent film formation due to vapor deposition from a diagonal direction. However, in case where a lying part for laying an electrode from the surface to the back of the substrate 1 needs to be formed on the side of the base, pattern formation grooves 13 are formed in the corresponding locations of shielding blocks 14 as shown in FIG. 5. Then, when vapor deposition is performed from a diagonal direction, since the shielding blocks 14 are close to the side of the base of the crystal resonator, no film is formed, but vapor deposition is not prevented in locations where the pattern formation grooves 13 are formed and an electrode laying line 21 which connects (not interrupted midway) the surface to the back of the base as shown in FIG. 4 is formed on the side.

The side electrode formed on the side of the drive section 17 need not be bisected in the thickness direction, and therefore it is not necessary to arrange any side electrode shielding/formation block (shielding block 14) around the drive section 17.

Furthermore, since a side electrode divided into upper and lower portions needs to be formed on both the right and left sides of the detection section 18, division blocks 15 are arranged outside the detection section 18 and also in a space between the detection section 18 and the adjacent drive section 17, as shown in FIG. 5. At this time, the division block 15 arranged between the detection section 18 and drive section 17 is designed to be kept sufficiently separate from the drive section 17 so that the formation of the film on the side of the drive section 17 is not blocked when vapor deposition in a diagonal direction is applied. More specifically, as shown in FIG. 5, it is designed in such a way that a distance L2 between the division block 15 and detection section 17 becomes at least 1.4 times the distance L1 between the division block 15 and detection section 18. To keep a metal film thickness equivalent to that of other drive sides, L2 is preferably set to at least 2.7 times L1.

According to the method of manufacturing the crystal resonator explained using FIG. 1, it is possible to easily create a small crystal resonator having a complicated electrode shape pattern accurately and easily by arranging the crystal tuning fork and the side electrode shielding/formation blocks 3 (shielding blocks 14 and division blocks 15) having the pattern formation grooves 13 in the vicinity of the crystal tuning fork as shown in FIG. 3.

According to the first embodiment (FIG. 3) and second embodiment (FIG. 5) of the present invention, the shielding blocks 14 are arranged around the base of the crystal resonator so that no side electrode except the electrode laying line 21 using the pattern formation grooves 13 is formed on the side of the base. However, if an electrode bisected in the thickness direction which extends in the length direction is also formed on the side of the base, many electrodes need not be formed on the surface of the base, and therefore it is possible to narrow the width of the base (especially, the narrowed section thereof).

Figure 6A:
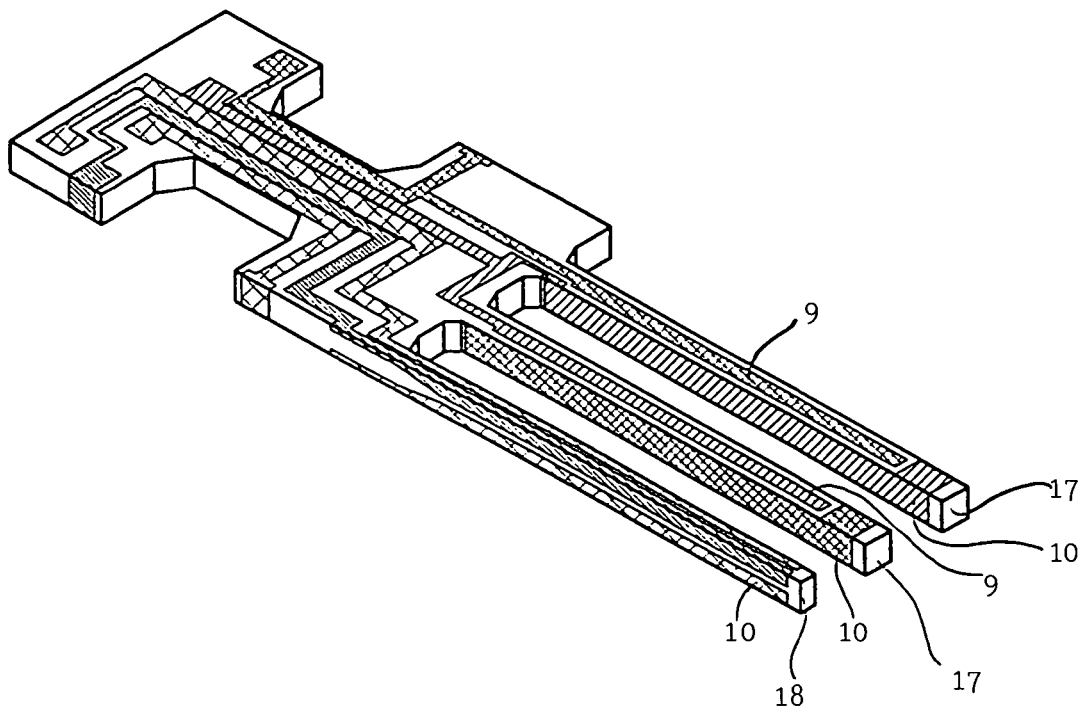
FIG. 6A and FIG. 6B show a first example and a second example of the crystal resonator manufactured using the method of the present invention.
Figure 6B:
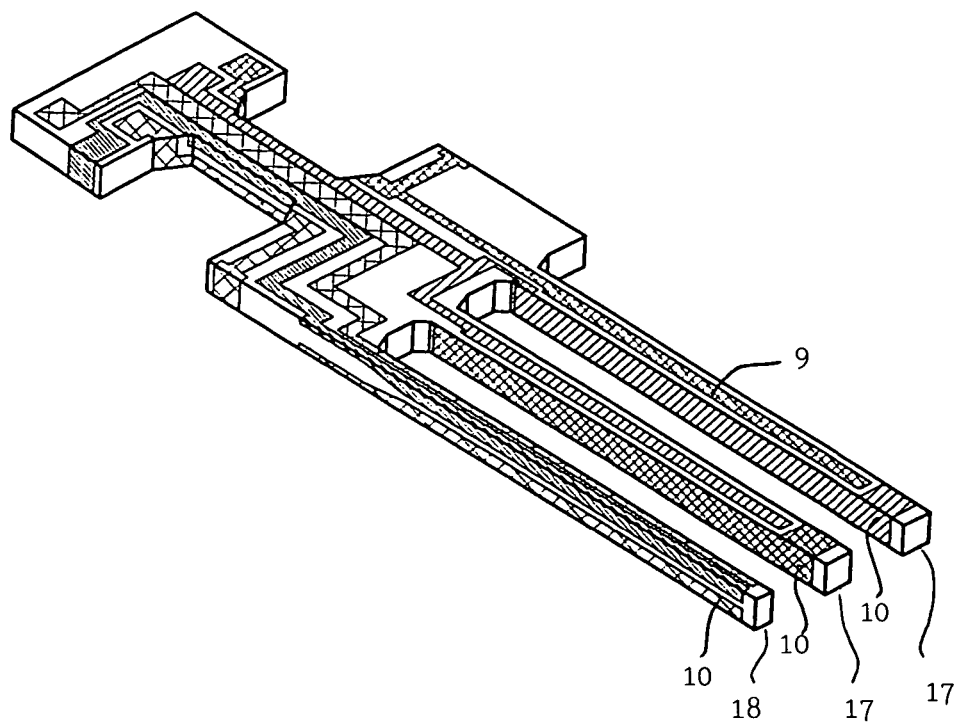
Figure 9:
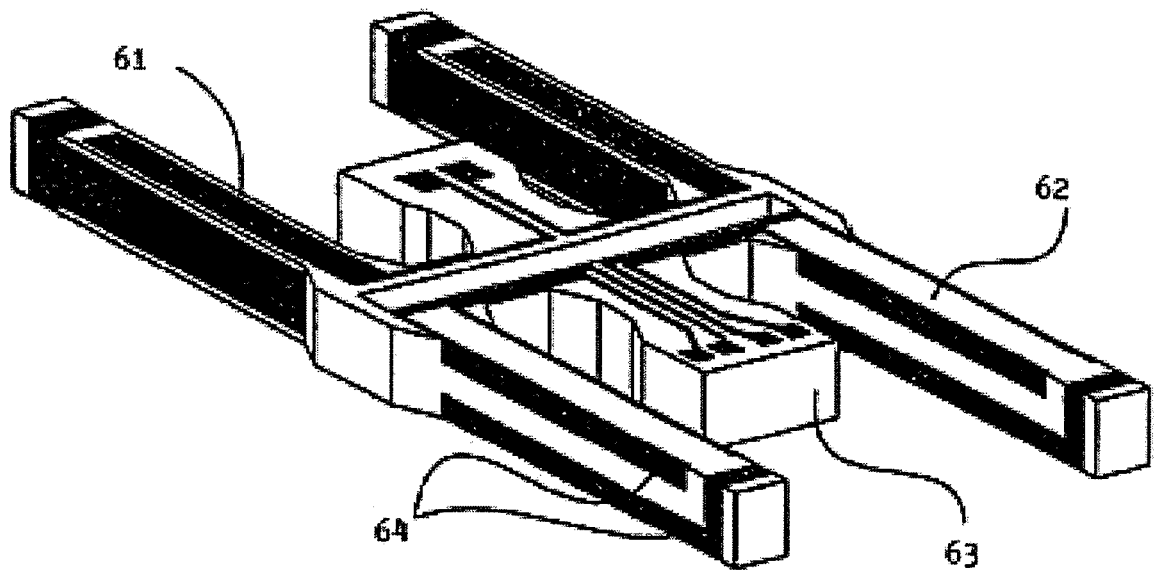
FIG. 9 is a perspective view showing a conventional example of a quartz crystal tuning fork.

FIG. 6A shows an example where an electrode 10 bisected in the thickness direction is formed on the side of the detection section 18 using the method according to the present invention but no bisected electrode is formed on the side of the base. For this reason, many (five) electrodes are placed in parallel on the surface of the base. On the contrary, FIG. 6B shows a case where two out of five electrodes arranged on the surface of the base are placed on the side, and therefore only three electrodes are arranged on the surface of the base. Therefore, in the case of FIG. 6B, it is possible to reduce the width of the narrowed section by an amount corresponding to two electrodes.

In the explanations of the present invention, processes relating to frequency adjustment, etc., are not explained, but such processes can be provided at some midpoint of the manufacturing process of the present invention.

Applying the manufacturing process of the present invention to the manufacturing process of a crystal resonator makes it possible to manufacture any form of resonator having an ultra-small surface electrode pattern or side electrode pattern at a high degree of accuracy.

The method of manufacturing a resonator according to the present invention has been explained using a three-tined quartz crystal tuning fork, but the number of tines is not limited to this and the present invention is also applicable to a resonator having other vibration modes such as thickness-shear mode, GT mode or DT mode which form electrode films using a vacuum deposition technology or a piezoelectric resonator made of lithium niobate.

As shown above, the manufacturing process of a crystal resonator according to the present invention can easily manufacture electrode patterns of a quartz crystal tuning fork which is created from a crystal substrate using a photo-etching technology, and can thereby have the effect of being able to obtain a crystal resonator at a sufficiently high degree of accuracy even if the shape of the crystal resonator or the shape of the electrode film is reduced to an ultra-small size.

Figure 10:
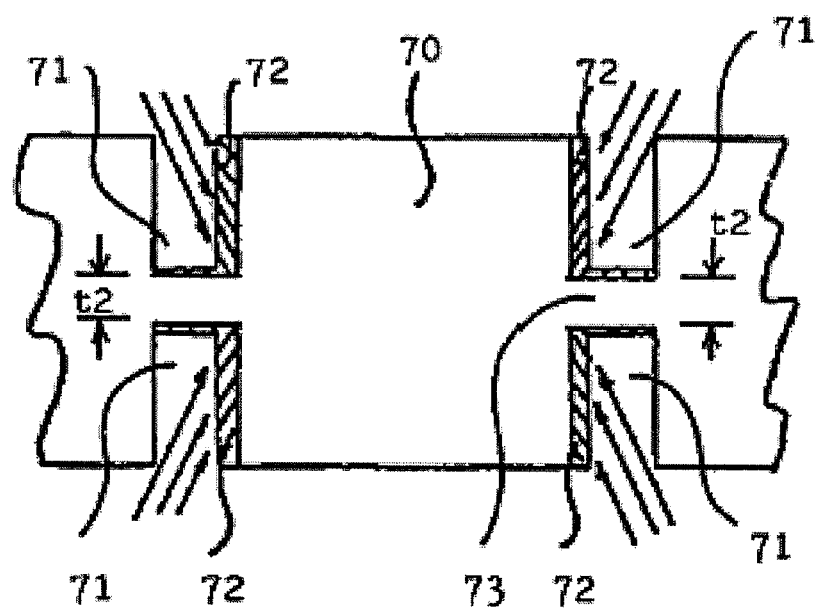
FIG. 10 is a partial cross-sectional view to illustrate the conventional technology of forming an electrode film on the side of a crystal substrate.

Furthermore, the present invention completely separates the crystal resonator from the side electrode shielding/formation block 3 by only leaving a tiny portion of the connection section 19 (see FIG. 5) through etching, and therefore the side on which a divided electrode is to be formed through vapor deposition is formed flatly. Therefore, it is possible to form a side electrode film of a desired width on the side using the side electrode shielding/formation blocks 3. For this reason, the present invention is free of such a problem as described above with reference to FIG. 10 that when grooves are formed on a crystal substrate to form a side electrode, the shape of the inner side becomes irregular and the width of the side electrode formed varies depending on the vapor deposition condition.

The invention claimed is:

1. A method of manufacturing a crystal resonator using a crystal substrate, comprising the steps of:
    forming a crystal resonator area and a side electrode shielding/formation block on said crystal substrate through etching by leaving a partial connection section, both said crystal resonator area and said side electrode shielding/formation block being separated from each other by a gap; and
    applying vapor deposition through said gap diagonally toward a side of said crystal substrate, whereby a film is formed on said side in a first area but film formation is prevented in a second area of said side due to the existence of said side electrode shielding/formation block, and thereby forming an electrode film bisected in the thickness direction of said substrate on said side.

2. The method of manufacturing a small crystal resonator according to claim 1, wherein by adjusting the size of said gap between said crystal resonator area and said side electrode shielding/formation block, said side electrode shielding/formation block is constructed in an area where said bisected electrode film is formed and an area where formation of the said electrode film is prevented.

3. The method of manufacturing a small crystal resonator according to claim 1, wherein vapor deposition toward said side of said crystal substrate is performed in a range of angle of incidence of ±45° to 55° with respect to said side.

4. The method of manufacturing a small crystal resonator according to claim 1, wherein said electrode film is divided into upper and lower portions and is formed on a vibration section of said crystal resonator.

5. The method of manufacturing a small crystal resonator according to claim 4, wherein $0.15t \leq d \leq 0.25t$ is held where t is the thickness of said vibration section and d is the distance between two bisected electrodes on said side, said side being on a tine for detection of Coriolis force.

6. The method of manufacturing a small crystal resonator according to claim 1,
   wherein said crystal resonator is a quartz crystal tuning fork including a vibration section made up of a base and a plurality of vibration tines which extend from said base, and
   wherein said electrode film is divided into upper and lower portions on said side, said side being a side of said vibration section and a side of said base.

7. The method of manufacturing a small crystal resonator according to claim 1,
   wherein said crystal resonator is a resonator for a vibration gyro having three vibration tines, and
   wherein said electrode film is divided into upper and lower portions on said side, said side being on a tine for detection of Coriolis force out of said three vibration tines.

8. The method of manufacturing a small crystal resonator according to any one of claims 1 to 7, wherein the thickness t of said crystal resonator is $100 \, \mu m \leq t \leq 350 \, \mu m$.

9. The method of manufacturing a small crystal resonator according to claim 1,
   wherein said crystal resonator is a quartz crystal tuning fork including a vibration section made up of a base and a plurality of vibration tines which extend from said base, and
   wherein part of said side electrode shielding/formation block is provided between said vibration tines.

* * * * *